(12) United States Patent
Komatsu et al.

(10) Patent No.: US 6,631,486 B1
(45) Date of Patent: Oct. 7, 2003

(54) SEMICONDUCTOR INTEGRATED CIRCUIT AND METHOD FOR TESTING THE SAME

(75) Inventors: Yoshihide Komatsu, Osaka (JP); Tadahiro Yoshida, Osaka (JP); Yukio Arima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/405,015

(22) Filed: Sep. 27, 1999

(30) Foreign Application Priority Data

Sep. 29, 1998 (JP) .......................... 10-274933

(51) Int. Cl.⁷ .............................. G01R 31/28
(52) U.S. Cl. ....................... 714/724; 324/765
(58) Field of Search ..................... 714/724, 731, 714/736, 700, 738, 718, 744, 30; 341/144; 377/343; 324/763, 765; 713/401, 503, 502, 500; 365/201; 438/18

(56) References Cited

U.S. PATENT DOCUMENTS 4,497,056 A * 1/1985 Sugamori ................. 714/736
5,177,630 A * 1/1993 Goutzoulis et al. ......... 359/135
5,818,250 A * 10/1998 Yeung et al. ............... 324/763

FOREIGN PATENT DOCUMENTS

JP  5-264673   10/1993   ......... G01R/31/318
JP  09033611   7/1997    ........... G01R/31/28

* cited by examiner

Primary Examiner—Albert Decady
Assistant Examiner—Guy Lamarre
(74) Attorney, Agent, or Firm—McDermott, Will & Emery

(57) ABSTRACT

A test enable signal Data_En is output from a data generator 11 in a tester 10 to a device under a test (DUT) 20. In the DUT 20, a first logic circuit 21 converts a signal pattern with an ordinary transfer rate, which has been stored on a register 28, into a high-transfer-rate signal pattern SpeedData_Tx with a high rate. And a transmitter 22 transmits the high-transfer-rate signal. During a test, the high-transfer-rate signal transmitted is received by, a receiver 23 with a switch 24 turned ON. Then, the high-transfer-rate signal received is output to a second logic circuit 26, which converts the high-transfer-rate signal into a low-transfer-rate signal Data_Rx with an ordinary rate. Finally, the low-transfer-rate signal is output to the tester 10 and compared to an expected value thereof by a comparator 12. In this manner, a semiconductor device operating at a high speed can be tested using a tester operating at a lower speed.

5 Claims, 7 Drawing Sheets

Fig. 1

Fig. 4(a) Data_En

Fig. 4(e) Data_Rx

SEMICONDUCTOR INTEGRATED CIRCUIT AND METHOD FOR TESTING THE SAME

BACKGROUND OF THE INVENTION

The present invention generally relates to an improved semiconductor integrated circuit operating at a high speed, and more particularly relates to a semiconductor integrated circuit that is testable by a tester operating at a speed lower than the operating speed of the integrated circuit.

Over the past few years, ultra-high-speed interfaces are under vigorous research and development, thereby tremendously speeding up the operation of an LSI. For example, according to the IEEE 1394 standard, it is now possible to present image data, which has been transmitted at a high transfer rate, on a display. In contrast, testers intended to test those high-speed-operating LSI's have not been developed so rapidly as the LSI's themselves up to now.

A conventional high-speed-LSI tester includes a data generator for generating data at a frequency approximately as high as the operating speed of an LSI under the test. The tester further includes a high-transfer-rate comparator for comparing a high-transfer-rate signal, which has been obtained as a result of testing the high-speed LSI and transferred at a high rate, to an expected value thereof. In performing a high-transfer-rate data transmission test on a device operating at a high speed, a low-transfer-rate data with a predetermined test pattern is generated by the data generator within the tester and input to the device under the test. Thereafter, the frequency of the input data is divided using a phase-locked loop (PLL) within a logic circuit included in the device under the test, thereby converting the low-transfer-rate input data into high-transfer-rate data. Then, the resultant high-transfer-rate data is transmitted from a high-speed. transmitter, which is included in the device under the test, to the tester. And the tester gets the received high-transfer-rate data compared by the high-transfer-rate comparator to the expected value thereof. In performing a high-transfer-rate data reception test on the other hand, high-transfer-rate data is transmitted from the data generator within the tester to the device under the test. In the device under the test, the high-transfer-rate data is received by a high-speed receiver, and then the frequency of the high-transfer-rate data is divided by an internal logic circuit, thereby converting the high-transfer-rate data into low-transfer-rate data. And then the tester gets the received low-transfer-rate data compared by the comparator to the expected value thereof.

Figure 7:
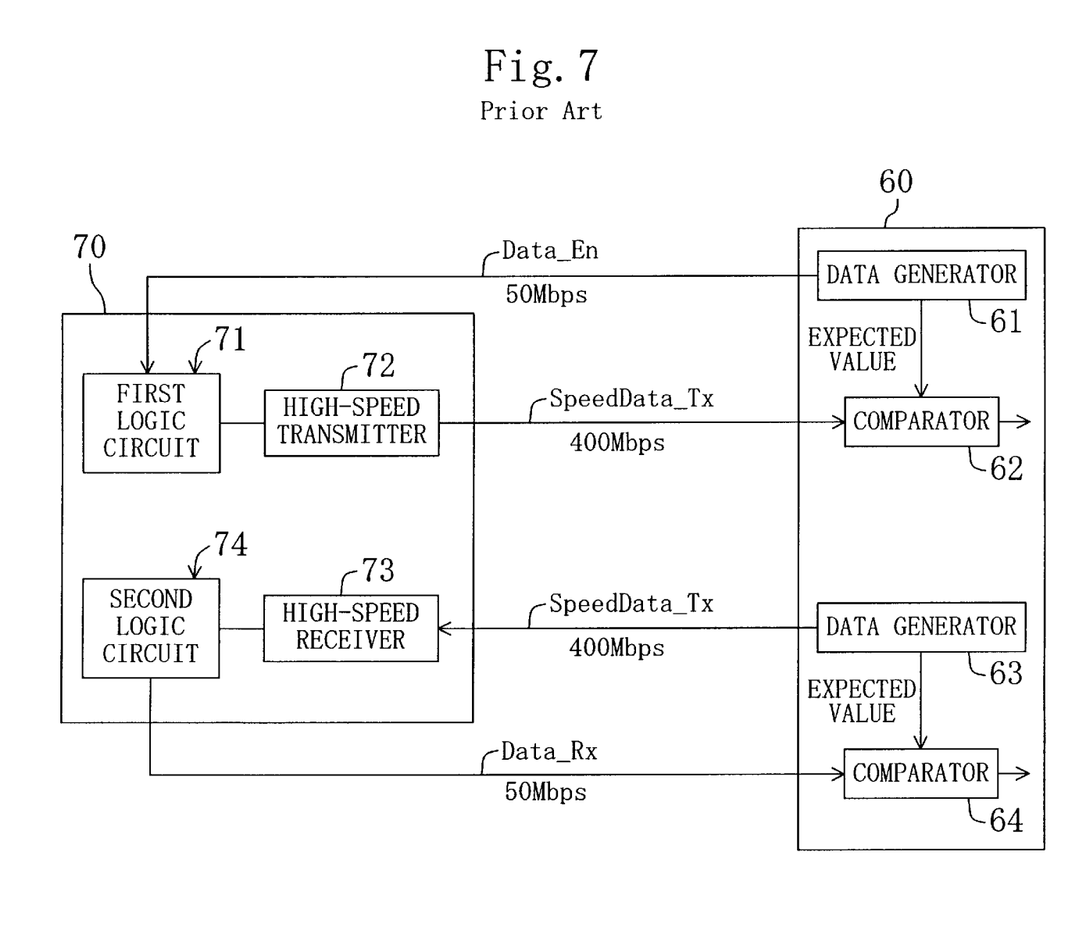
FIG. 7 illustrates conventional tester and device under the test.

FIG. 7 illustrates how a high-speed device is tested using a conventional tester. In the illustrated example, a high-speed-LSI tester J971 (manufactured by Teradyne Corp., USA) may be used. In performing a high-transfer-rate data transmission test on a device 70 under the test (DUT), i.e., if the DUT 70 requires a high-rate transfer, an input test pattern with an ordinary transfer rate of 50 Mbps, for example, is generated by a data generator 61 in a tester 60 and input to the DUT 70. The input pattern is received by a first logic circuit 71 in the DUT 70. Thereafter, the frequency of the input pattern is divided using a PLL (not shown), for example, within the first logic circuit 71, thereby converting the input pattern into a pattern signal with a transfer rate as high as 400 Mbps, for example. Then, the resultant high-transfer-rate pattern signal is transmitted from a high-speed a transmitter 72 to the tester 60. And the tester 60 gets the received high-transfer-rate pattern signal compared by a high-transfer-rate comparator 62 to an expected pattern thereof supplied from the data generator 61.

In performing a high-transfer-rate data reception test on the other hand, a high-transfer-rate data generator 63 included in the tester 60 outputs a high-transfer-rate pattern signal to the DUT 70 at a transfer rate as high as the data transfer rate (e.g., 400 Mbps) of the DUT 70. In the DUT 70, the high-transfer-rate pattern signal is received by a high-speed receiver 73, and then the frequency of the high-transfer-rate pattern signal is divided by a second logic circuit 74, thereby converting the high-transfer-rate pattern signal into a low-transfer-rate pattern signal with an ordinary transfer rate (e.g., 50 Mbps). And then the tester 60 gets the received low-transfer-rate pattern signal compared by a comparator 64 to the expected value thereof.

Accordingly, the conventional tester 60 needs to include the high-transfer-rate comparator 62 for the high-transfer-rate data transmission test and the high-transfer-rate data generator 63 for the high-transfer-rate data reception test.

The high-transfer-rate comparator 62 and high-transfer-rate data generator 63 of the tester 60, however, are both very expensive. Thus, the test cost adversely increases with these components.

In addition, since semiconductor integrated circuits have been further modified to operate at increasingly high speeds in recent years, such an LSI tester cannot satisfactorily catch up with the latest trend in the art. Also, even if the testers could catch up with the semiconductor integrated circuits increasing their speeds day after day, it would take enormous costs to develop a brand-new tester operating as fast as the state-of-the-art semiconductor integrated circuit every time the integrated circuit has increased its speed. Furthermore, even if a brand-new LSI tester is developed by a maker every time an LSI has increased it speed, older LSI testers manufactured by the other makers will also be used. In such a situation, it would take a long time to convert programs.

Moreover, once a device under test has increased its operating speed, skewing of a transferred signal and/or a voltage drop thereof caused during the propagation through interconnection lines should also be tested. The conventional tester can control the delay or voltage drop, and therefore, the worst-case skew can be tested as for a signal to be received by the device under the test. However, the worst-case signal skewing or voltage drop, which has been caused in the device under the test itself, cannot be tested.

SUMMARY OF THE INVENTION

An object of the present invention is providing a semiconductor integrated circuit that is testable by an ordinary tester applicable to low-transfer-rate signals.

Another object of the present invention is providing a method for testing a semiconductor integrated circuit with respect to the worst-case voltage drop and skewing, which might happen in the integrated circuit while a high-transfer-rate signal is being transmitted, by intentionally causing that voltage drop and skewing in the circuit.

To achieve these objects, according to the present invention, a high-transfer-rate signal, which has been transmitted from a transmitter in a semiconductor integrated circuit, is received by a receiver within the same circuit and then converted into a low-transfer-rate signal to be sent back to, and tested by, a tester.

In addition, according to the present invention, a potential controller for getting the potential of the high-transfer-rate signal dropped and a delay circuit for causing a compulsory skew between two signals included in a high-transfer-rate differential signal are provided for the semiconductor integrated circuit under the test.

A semiconductor integrated circuit of the present invention includes a transmitter for transmitting a high-transfer-rate signal and a receiver. The integrated circuit is characterized by further including: a first logic circuit for receiving a low-transfer-rate signal from an external tester, generating the high-transfer-rate signal responsive to the low-transfer-rate signal and outputting the high-transfer-rate signal to the transmitter while the integrated circuit is connected to the external tester to carry out a test; a signal line coupling the transmitter and receiver together; switching means, which is provided for the signal line and is turned ON during the test to transmit the high-transfer-rate signal from the transmitter to the receiver; and a second logic circuit for receiving the high-transfer-rate signal from the receiver and converting the high-transfer-rate signal into another low-transfer-rate signal.

In one embodiment of the present invention, the first logic circuit preferably includes a potential controller for raising or lowering a potential level of the high-transfer-rate signal to be generated.

Another semiconductor integrated circuit according to the present invention includes a transmitter for transmitting a high-transfer-rate differential signal consisting of two signals and a receiver. The integrated circuit is characterized by further including: a first logic circuit for receiving a low-transfer-rate signal from an external tester, generating the high-transfer-rate differential signal responsive to the low-transfer-rate signal and outputting the high-transfer-rate differential signal to the transmitter while the integrated circuit is connected to the external tester to carry out a test; a differential pair of signal lines for coupling the transmitter and receiver together; switching means, which is provided for the signal lines and is turned ON during the test to transmit the high-transfer-rate differential signal from the transmitter to the receiver; a second logic circuit for receiving the high-transfer-rate differential signal from the receiver and converting the high-transfer-rate differential signal into another low-transfer-rate signal; and a delay circuit for delaying one of the two signals included in the high-transfer-rate differential signal to be input to the second logic circuit.

In one embodiment of the present invention, the first logic circuit preferably includes a potential controller for raising or lowering a potential level of the high-transfer-rate differential signal to be generated.

Still another semiconductor integrated circuit according to the present invention includes a first logic circuit for receiving a low-transfer-rate signal from an external tester, generating a high-transfer-rate differential signal and outputting the high-transfer-rate differential signal to a transmitter while the integrated circuit is connected to the external tester to carry out a test. The high-transfer-rate differential signal consists of a data signal and a strobe signal. The integrated circuit further includes: the transmitter for transmitting the high-transfer-rate differential signal; a receiver for receiving the high-transfer-rate differential signal from the transmitter with the data and strobe signals interchanged during the, test; a second logic circuit for receiving the high-transfer-rate differential signal from the receiver and converting the strobe signal included in the high-transfer-rate differential signal into another low-transfer-rate signal; and a storage circuit for storing thereon an expected value of the low-transfer-rate signal obtained by the second logic circuit through the conversion.

Yet another semiconductor integrated circuit according to the present invention includes first and second transmitter/receiver pairs. Each said pair consists of a transmitter and a receiver. Each said transmitter transmits a high-transfer-rate differential signal. The integrated circuit further includes a first logic circuit for receiving a low-transfer-rate signal from an external tester, generating the high-transfer-rate differential signal responsive to the low-transfer-rate signal and outputting the high-transfer-rate differential signal to the transmitter belonging to the first pair while the integrated circuit is connected to the external tester to carry out a test. The transmitter belonging to the first pair is connected to the receiver belonging to the second pair via a differential cable during the test. The integrated circuit further includes a second logic circuit for converting the high-transfer-rate differential signal, which has been transmitted from the transmitter belonging to the first pair, passed through the differential cable and then received by the receiver belonging to the second pair, into another low-transfer-rate signal during the test.

A testing method according to the present invention is adapted to test a semiconductor integrated circuit including a transmitter for transmitting a high-transfer-rate signal and a receiver. The method includes the steps of: receiving a low-transfer-rate signal and generating the high-transfer-rate signal responsive to the low-transfer-rate signal; transmitting the high-transfer-rate signal from the transmitter; receiving the transmitted high-transfer-rate signal at the receiver; converting the high-transfer-rate signal received into another low-transfer-rate signal; and comparing the low-transfer-rate signal obtained by the conversion to an expected value of the low-transfer-rate signal.

Another testing method according to the present invention is adapted to test a semiconductor integrated circuit including a transmitter for transmitting a high-transfer-rate differential signal and a receiver. The high-transfer-rate differential signal consists of a data signal and a strobe signal. The method includes the steps of: receiving the high-transfer-rate differential signal, which has been transmitted from the transmitter, with the data and, strobe signals interchanged; and comparing the strobe signal in the high-transfer-rate differential signal received to an expected value of the strobe signal.

According to the present invention, the high-transfer-rate data, which has been supposed to be output from a transmitter to an external tester in a conventional testing method, is received by the receiver and converted into low-transfer-rate data within the device under the test. And then a test is performed based on the low-transfer-rate data. Thus, according to the present invention, there is no need to provide either the high-transfer-rate comparator 62 or the high-transfer-rate data generator 63 for the tester. Accordingly, a semiconductor integrated circuit for transferring data at a high rate can be tested just as expected using an inexpensive tester.

In addition, according to the present invention, while the device is being tested, the potential controller can gradually lower the potential level of the high-transfer-rate signal, which will be transmitted by the transmitter, from a predetermined voltage, e.g., 3.3 V. Thus, the worst-case voltage drop of the device under the test can be known by the test. That is to say, it is possible to know the lowest permissible potential level of the high-transfer-rate signal, at which the device under the test starts to operate erroneously in the normal operation mode.

Moreover, according to the present invention, the delay circuit causes a compulsory delay between the two signals included in the high-transfer-rate differential signal. Thus, the worst-case delay of the device under the test can be known by the test. That is to say, it is possible to know the longest permissible skew of the high-transfer-rate differential signal, at which the device under the test starts to operate erroneously.

Furthermore, according to the present invention, even if the receiver receives the high-transfer-rate differential signal with the data and strobe signals interchanged during the test, the device still can be tested properly by comparing the strobe signal received by the receiver to an expected value thereof stored in the storage circuit. This is because the expected value stored is that of the original data signal.

Also, according to the present invention, the transmitter belonging to one of the pairs is connected to the receiver belonging to the other pair via the differential cable during the test. Thus, the data signal, which is included in the high-transfer-rate differential signal transmitted from the transmitter, is received at the receiver correctly as the data signal itself.

DESCRIPTION OF THE PREFERRED EMBODIMENTS

Hereinafter, preferred embodiments of the present invention will be described with reference to the accompanying drawings.

EMBODIMENT 1

Figure 1:
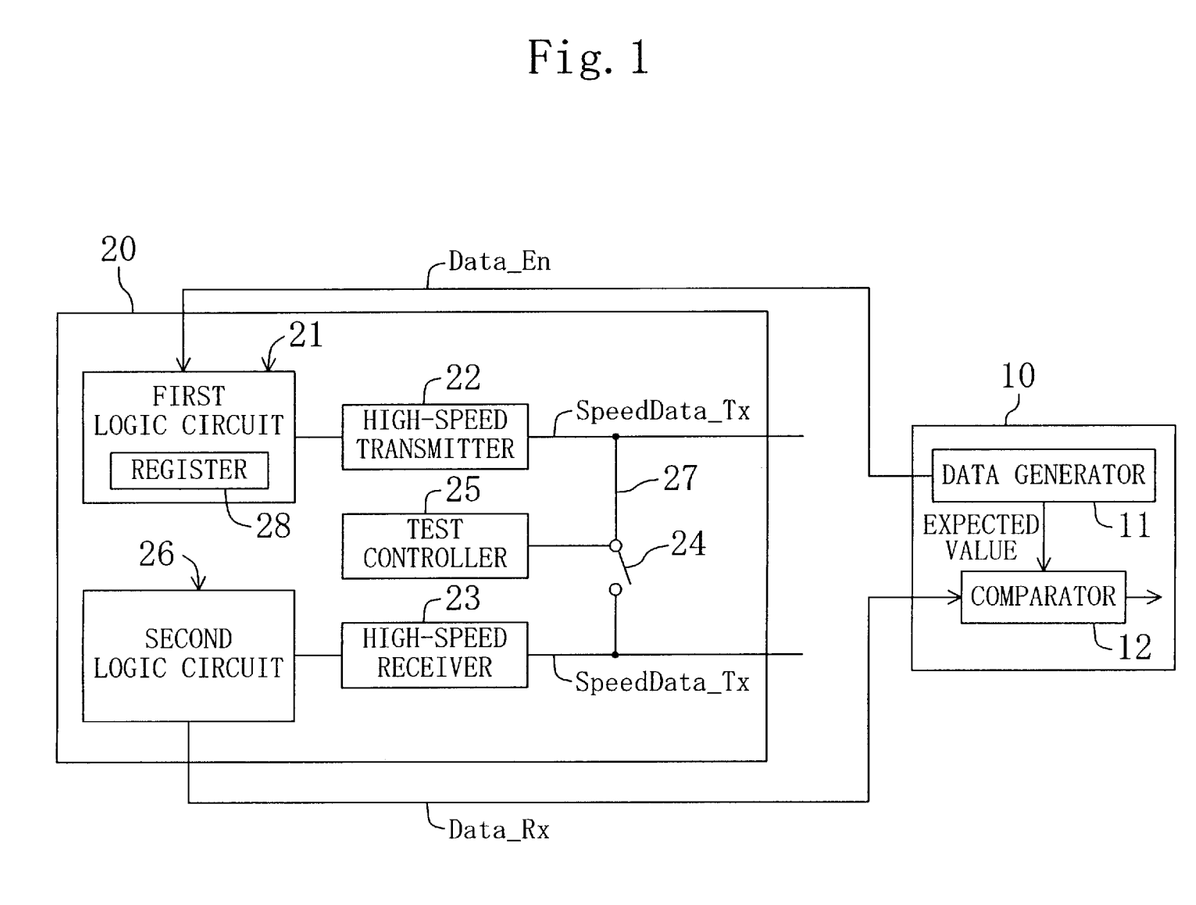
FIG. 1 illustrates an overall arrangement for testing a semiconductor integrated circuit according to a first embodiment of the present invention.

FIG. 1 illustrates an overall block arrangement for testing a semiconductor integrated circuit according to a first embodiment of the present invention. Specifically, the semiconductor integrated circuit, or a device under test (DUT) 20, is tested using a tester 10.

The tester 10 includes a data generator 11 and a comparator 12. The data generator 11 generates a test enable signal Data_En. The comparator 12 compares an output signal pattern Data_Rx, which has been transmitted from the DUT 20 at a low transfer rate (e.g., about 50 Mbps), to an expected value thereof supplied from the data generator 11.

The DUT 20 includes a first logic circuit 21 for receiving the test enable signal Data_En from the data generator 11 of the tester 10. The first logic circuit 21 includes a register 28 for storing thereon a low-transfer-rate (e.g., about 50 Mbps) signal pattern in advance. While the test enable signal Data_En is being supplied during a test, the first logic circuit 21 divides the frequency of the low-transfer-rate signal pattern stored on the register 28, thereby generating and outputting a high-transfer-rate signal pattern SpeedData_Tx with a transfer rate (e.g., about 400 Mbps) higher than the ordinary one.

The DUT 20 further includes a high-speed transmitter 22 for transmitting the high-transfer-rate signal pattern SpeedData_Tx and a high-speed receiver 23. The high-speed transmitter 22 and receiver 23 are coupled together via a signal line 27, for which a switch 24 (i.e., switching means as defined in the appended claims) is provided. The switch 24 is controlled by a test controller 25. While the DUT 20 is receiving the test enable signal Data_En from the tester 10 during a test, the test controller 25 turns the switch 24 ON, thereby getting the high-transfer-rate signal pattern SpeedData_Tx, which has been transmitted from the high-speed transmitter 22, received by the high-speed receiver 23.

The DUT 20 further includes a second logic circuit 26. The second logic circuit 26 down-converts the high-transfer-rate signal pattern SpeedData_Tx with a rate as high as about 400 Mbps, which has been received by the high-speed receiver 23, into a low-transfer-rate signal pattern Data_Rx with an ordinary rate of about 50 Mbps. That down-converted low-transfer-rate signal pattern Data_Rx is output to the tester 10.

Next, it will be described in further detail how the semiconductor integrated circuit according to this embodiment is tested. As shown in FIG. 1, when the data generator 11 of the tester 10 outputs the test enable signal Data_En to the DUT 20, the first logic circuit 21 in the DUT 20 converts the test pattern with a low transfer rate of about 50 Mbps, which is stored in the register 28, into the high-transfer-rate signal (test pattern) SpeedData_Tx with a rate as high as about 400 Mbps. Then, the test pattern is transmitted from the high-speed transmitter 22.

During the test, the switch 24 in the DUT 20 is turned ON so that the high-speed receiver 23 receives the test pattern SpeedData_Tx as it is inside the DUT 20. The ON/OFF states of the switch 24 are controlled by the test controller 25. That is to say, the controller 25 turns the switch 24 ON during the test and turns the switch 24 OFF during a normal operation. Since that section is now short-circuited in the DUT 20, the high-speed receiver 23 receives the test pattern SpeedData_Tx at about 400 Mbps and instantaneously passes the received pattern to the second logic circuit 26 at the same high transfer rate. In response, the second logic circuit 26 divides the frequency of the received pattern SpeedData_Tx at about 400 Mbps to obtain a low-transfer-rate pattern Data_Rx at about 50 Mbps, which can be dealt with even by the comparator 12 in the tester 10. Then, the second logic circuit 26 outputs the low-transfer-rate pattern Data_Rx to the comparator 12 in the tester 10. Finally, the comparator 12 compares the low-transfer-rate pattern Data_

Rx supplied from the DUT 20 to an expected pattern supplied from the data generator 11 of the tester 10 at the transfer rate of 50 Mbps.

Thus, in the arrangement shown in FIG. 1, the high-speed transmitter 22 and receiver 23 are short-circuited with each other in the DUT 20 by turning the switch 24 ON during the test. Also, during the test, the high-transfer-rate test pattern SpeedData_Tx received at the receiver 23 is converted into the low-transfer-rate pattern Data_Rx with an ordinary transfer rate. Thus, the tester 10 can carry out a high-rate data transfer test by outputting the test enable signal Data_En at the ordinary transfer rate of about 50 Mbps. In other words, the high-transfer-rate signal pattern SpeedData_Tx, which has been output from the high-speed transmitter 22 at about 400 Mbps, is not transmitted to the tester 10 instantaneously unlike the conventional., testing method. Instead, the high-transfer-rate signal pattern SpeedData_Tx is once received by the receiver 23 inside the DUT 20 and converted by the second logic circuit 26 into the low-transfer-rate pattern Data_Rx with an ordinary rate of about 50 Mbps through the frequency division. And then the low-transfer-rate pattern is sent back to the tester 10 to be tested by the comparator 12 in the tester 10. Thus, the tester 10 does not need either the data generator or comparator specially designed for high-transfer-rate signals.

Also, since the DUT 20 includes the switch 24 and test controller 25, the test of the DUT 20 can be started by short-circuiting the high-speed transmitter 22 and receiver 23 when the mode of operation of the DUT is switched from normal operation into test.

EMBODIMENT 2

Figure 2:
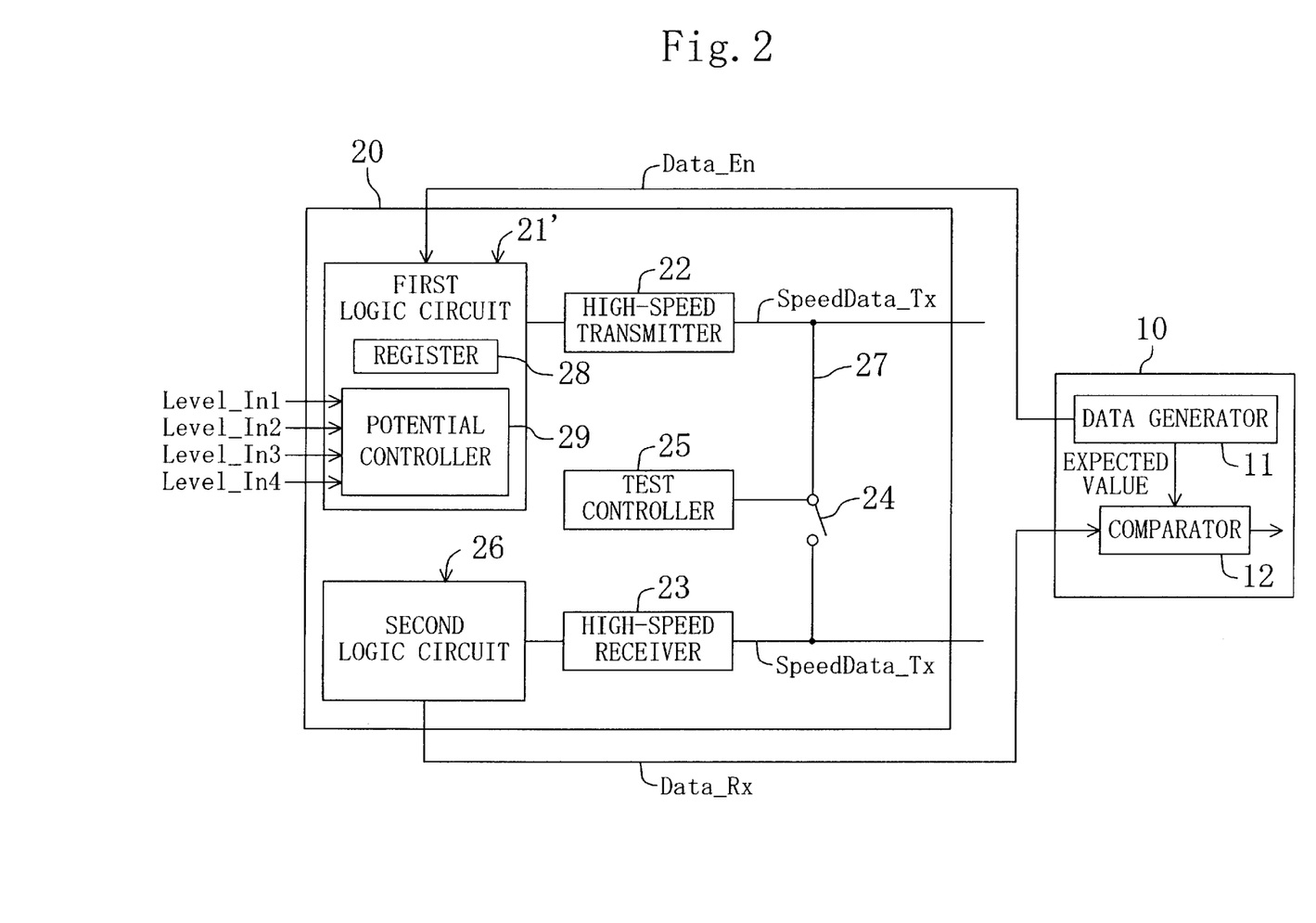
FIG. 2 illustrates an overall arrangement for testing a semiconductor integrated circuit according to a second embodiment of the present invention.

FIG. 2 illustrates a second embodiment of the present invention. In the DUT 20' shown in FIG. 2, a first logic circuit 21' includes a potential controller 29. The potential controller 29 drops the center potential (e.g., about 1.8 V) of the high-transfer-rate signal pattern, which has been obtained by the first logic circuit 21' through the up conversion to have a transfer rate of about 400 Mbps, within an arbitrary voltage range of about 0.5 V, for example. Then, the first logic circuit 21' outputs the high-transfer-rate signal SpeedData_Tx with a dropped potential to the transmitter 22. The potential controller 29 receives 4-bit level control signals Level_In1, Level_In2, Level_In3 and Level_In4 from an external component. The magnitude of the voltage drop or rise is determined based on the combination of these control signals for the high-transfer-rate signal SpeedData_Tx. For example, if the combination of these signals is "0001", then the potential is dropped by 10 mV. Or if the combination is "0100", then the potential is raised by 100 mV.

In the other respects, the DUT 20' and the tester 10 are the same as the counterparts according to the first embodiment. That is to say, the high-speed transmitter 22 transmits the high-transfer-rate signal pattern SpeedData_Tx to the high-speed receiver 23. The second logic circuit 26 receives the high-transfer-rate signal pattern SpeedData_Tx with the dropped center potential, converts the high-transfer-rate signal pattern into the low-transfer-rate signal pattern Data_Rx at about 50 Mbps and then outputs the low-transfer-rate signal pattern to the tester 10.

According to the second embodiment, the potential controller 29 can drop or raise the center potential of the high-transfer-rate signal pattern SpeedData_Tx within the predetermined voltage range of about 0.5 V, for example. Thus, it is possible to know the worst-case voltage drop of the high-transfer-rate signal that is caused within the DUT 20 during the normal operation of the DUT 20.

EMBODIMENT 3

Figure 3:
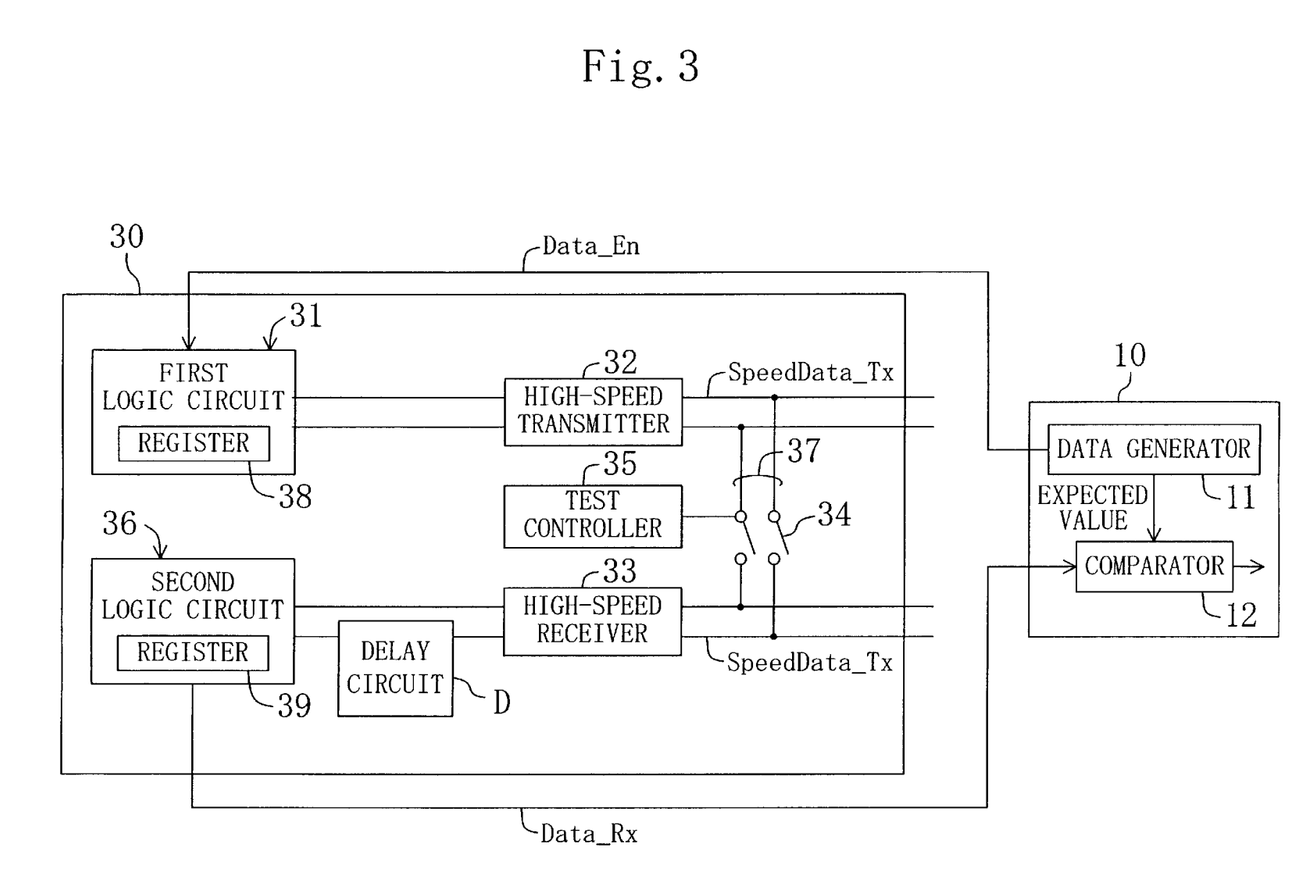
FIG. 3 illustrates an overall arrangement for testing a semiconductor integrated circuit according to a third embodiment of the present invention.

Next, a third exemplary embodiment of the present invention will be described. FIG. 3 illustrates an overall block arrangement for testing a semiconductor integrated circuit according to the third embodiment.

Figure 4A:
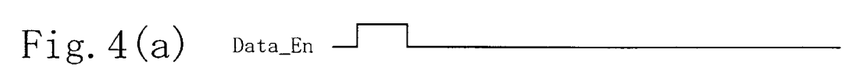
FIG. 4(a) illustrates the waveform of a test enable signal according to the third embodiment.
Figure 4B:
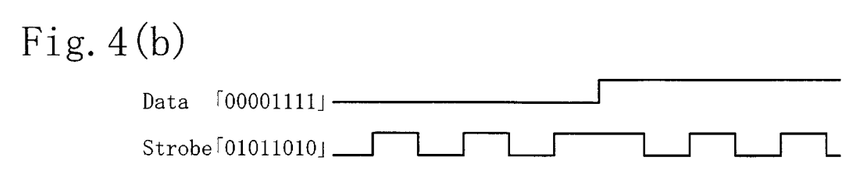
FIG. 4(b) illustrates the waveforms of low-transfer-rate data signals to be stored on the register in the first logic circuit.
Figure 4C:
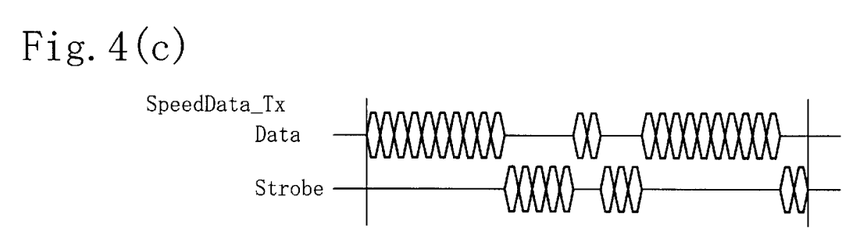
FIG. 4(c) illustrates the waveforms of a pair of signals included in a high-transfer-rate differential signal.

As shown in FIG. 3, the DUT 30 includes a first logic circuit 31 for receiving the test enable signal Data_En shown in FIG. 4(a) from the data generator 11 included in the tester 10. The first logic circuit 31 includes a register 38 for storing thereon a low-transfer-rate signal pattern shown in FIG. 4(b) with an ordinary rate (e.g., about 50 Mbps) in advance. The first logic circuit 31 further includes a DS encoder (not shown). While the test enable signal Data_En is being supplied during a test, the DS encoder divides the frequency of the low-transfer-rate signal pattern stored on the register 38, thereby generating and outputting a high-transfer-rate differential signal pattern SpeedData_Tx with a rate (e.g., about 400 Mbps) higher than the ordinary one. As shown in FIG. 4(c), the high-transfer-rate differential signal pattern SpeedData_Tx is a differential signal consisting of a data signal Data and a strobe signal Strobe.

The DUT 30 further includes: a high-speed transmitter 32 for transmitting the high-transfer-rate differential signal pattern SpeedData_Tx supplied from the first logic circuit 31; and a high-speed receiver 33. The high-speed transmitter 32 and receiver 33 are coupled together via a differential pair of signal lines 37, for which a switch 34 is provided. During a test, a test controller 35 turns the switch 34 ON, thereby getting the high-transfer-rate differential signal pattern SpeedData_Tx, which has been output from the high-speed transmitter 32, received by the high-speed receiver 33 in the DUT 30.

The DUT 30 further includes a second logic circuit 36. The second logic circuit 36 includes a DS decoder (not shown) for down-converting the high-transfer-rate differential signal pattern SpeedData_Tx at about 400 Mbps, which has been received by the high-speed receiver 33, into a low-transfer-rate differential signal pattern Data_Rx with an ordinary rate of about 50 Mbps. That down-converted low-transfer-rate differential signal pattern Data_Rx also consists of a data signal and a strobe signal like the high-transfer-rate differential signal pattern. The second logic circuit 36 further includes a register (i.e., the storage circuit as defined in the appended claims) 39 for storing thereon an expected value of the low-transfer-rate signal pattern that has been obtained by the down conversion. The second logic circuit 36 compares the low-transfer-rate signal pattern to the expected value stored on the register 39 and then outputs a comparison result signal Data_Rx shown in FIG. 4(e) to the tester 10. As shown in FIG. 3, the high-speed receiver 33 and second logic circuit 36 are also coupled together via a differential pair of signal lines. A delay circuit D is disposed on one of these lines that is provided for transmitting the strobe signal.

Next, it will be described in further detail how the semiconductor integrated circuit according to this embodiment is tested. As shown in FIG. 3, the data generator 11 in the tester 10 outputs the test enable signal Data_En to the first logic circuit 31 in the DUT 30.

In the DUT 30, the first logic circuit 31 receives the test enable signal Data_En at about 50 Mbps and generates the high-transfer-rate test pattern SpeedData_Tx with the natural frequency of the DUT 30 at about 400 Mbps. In this case, the DS encoder in the first logic circuit 31 generates the differential signal pattern consisting of the data and strobe signals as the high-transfer-rate test pattern SpeedData_Tx and then outputs the signal pattern to the high-speed transmitter 32.

During the test, the switch 34 in the DUT 30 is turned ON by the test controller 35 so that the high-speed receiver 33 receives the high-transfer-rate differential signal SpeedData_Tx transmitted from the high-speed transmitter 32 as it is inside the DUT 30. The high-transfer-rate differential pattern SpeedData_Tx received is output to the second logic circuit 36 at the same high transfer rate.

While the high-transfer-rate differential signal pattern SpeedData_Tx is being transmitted from the high-speed receiver 33 to the second logic circuit 36, the signal pattern passes through the delay circuit D disposed on the strobe signal line. The delay circuit D compulsorily delays the strobe signal pattern. Thus, the delayed strobe signal is input to the DS decoder in the second logic circuit 36. The DS decoder in the second logic circuit 36 decodes the encoded high-transfer-rate differential signal pattern, thereby downconverting the received high-transfer-rate pattern SpeedData_Tx at about 400 Mbps into the low-transfer-rate differential signal pattern Data_Rx with an ordinary frequency of about 50 Mbps. Then, the low-transfer-rate differential signal pattern is compared to the expected value thereof stored on the register 39 in the second logic circuit 36. And the comparison result signal Data_Rx is output to the tester 10. In the tester 10, the comparator 12 compares the comparison result signal Data_Rx supplied from the DUT 30 to the expected value thereof supplied from the data generator 11.

According to the third embodiment, the delay circuit D compulsorily delays the strobe signal included in the high-transfer-rate differential signal. Thus, an arbitrary skew can be caused in the high-transfer-rate differential signal while the DUT 30 is connected to the tester 10, for example. Therefore, if the delay caused by the delay circuit D is changed to various values, then the worst-case skew (i.e., the maximum skew) of the high-transfer-rate differential signal can be known.

In addition, since the first logic circuit 31 includes the DS encoder, a differential signal pattern, which consists of an appropriate pair of data and strobe signals best suited to a testing purpose, can be generated during the test. Also, a clock signal is generated based on the data and strobe signals. Thus, the transmitter 32 and receiver 33 can operate responsive to high-frequency clock pulses. Moreover, since an edge of the clock signal generated is delayed from the associated edge of the data signal, the strobe signal delayed by the delay circuit D can be latched in synchronism with the clock signal.

In this embodiment, the delay circuit D is disposed on the strobe signal line. Alternatively, the delay circuit D may be naturally disposed on the data signal line. That is to say, the delay circuit D may be disposed on either signal line of the differential pair between the receiver 33 and second logic circuit 36.

Also, the first logic circuit 31 shown in FIG. 3 may be replaced with the first logic circuit 21' shown in FIG. 2. That is to say, the potential controller 29 may also be provided for the first logic circuit.

EMBODIMENT 4

Next, a fourth exemplary embodiment of the present invention will be described with reference to FIG. 5. In this embodiment, it will be described how to test a semiconductor integrated circuit including a transmitter-receiver, which is implemented as a physical-layer LSI complying with the IEEE 1394 standard.

Figure 5:
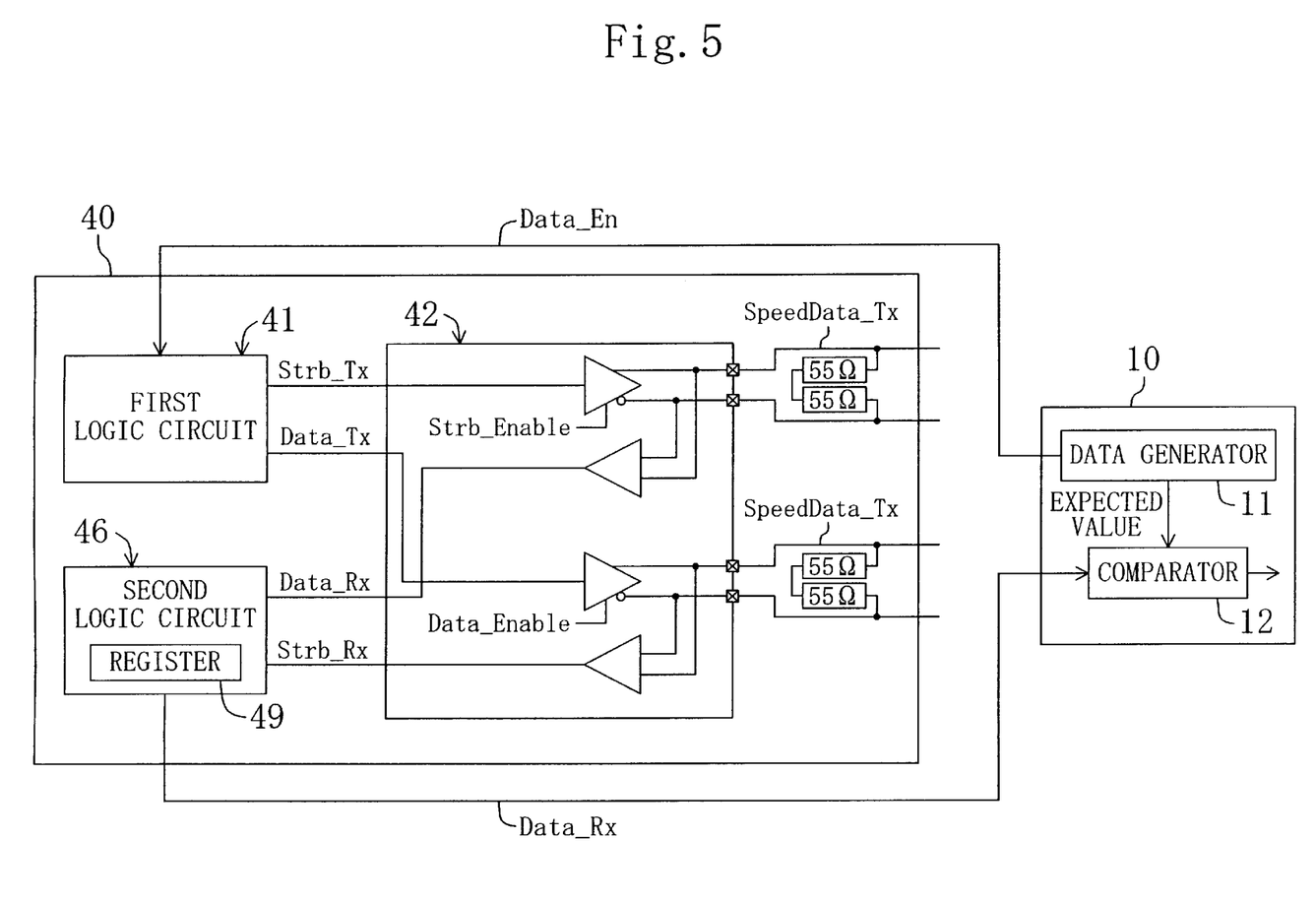
FIG. 5 illustrates an overall arrangement for testing a semiconductor integrated circuit according to a fourth embodiment of the present invention.

As shown in FIG. 5, when a test mode is specified, a data signal is received as a strobe signal within a high-speed transmitter-receiver 42 through a short-circuit structure between the signal outputting and inputting ends of the transmitter-receiver 42 inside the DUT 40. In the normal operation mode, the data signal cannot be received as the strobe signal. To receive the data signal as the strobe signal in the test mode, an expected value of the strobe signal should be stored in advance on a register 49 in a second logic circuit 46. More specifically, this operation is performed in the following manner.

Figure 4D:
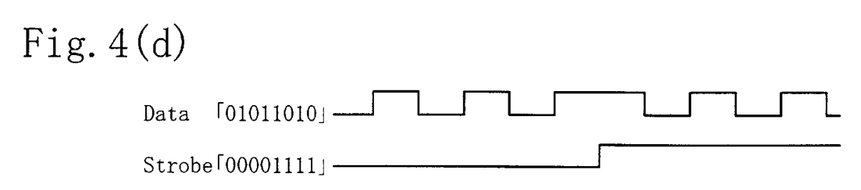
FIG. 4(d) illustrates the waveforms of low-transfer-rate data signals obtained through the conversion by the second logic circuit according to the fourth embodiment.
Figure 4E:
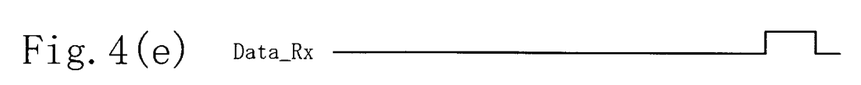
FIG. 4(e) illustrates the waveform of a comparison result signal output from the second logic circuit according to the third embodiment to the tester.

According to the IEEE 1394 standard, a clock signal is generated using the data and strobe signals as two different inputs in an exclusive-OR function. Also, in the test mode, the data signal Data and strobe signal. Strobe are received after having been interchanged as shown in FIG. 4(d). For example, suppose a data signal "101011010" has been transmitted at a high transfer rate. Then, the high-speed transmitter-receiver 42 receives a strobe signal "00001111" at a high rate inside the circuit. Accordingly, if the pattern of the received strobe signal is stored as an expected value on the register 49, then a test can be carried out.

According to the fourth embodiment, no switch is provided for the shortcircuit structure within the transmitter-receiver 42 unlike the first and second embodiments. In the other respects, the semiconductor integrated circuit according to the fourth embodiment is the same as the counterpart according to the third embodiment, and the description thereof will be omitted herein.

EMBODIMENT 5

Figure 6:
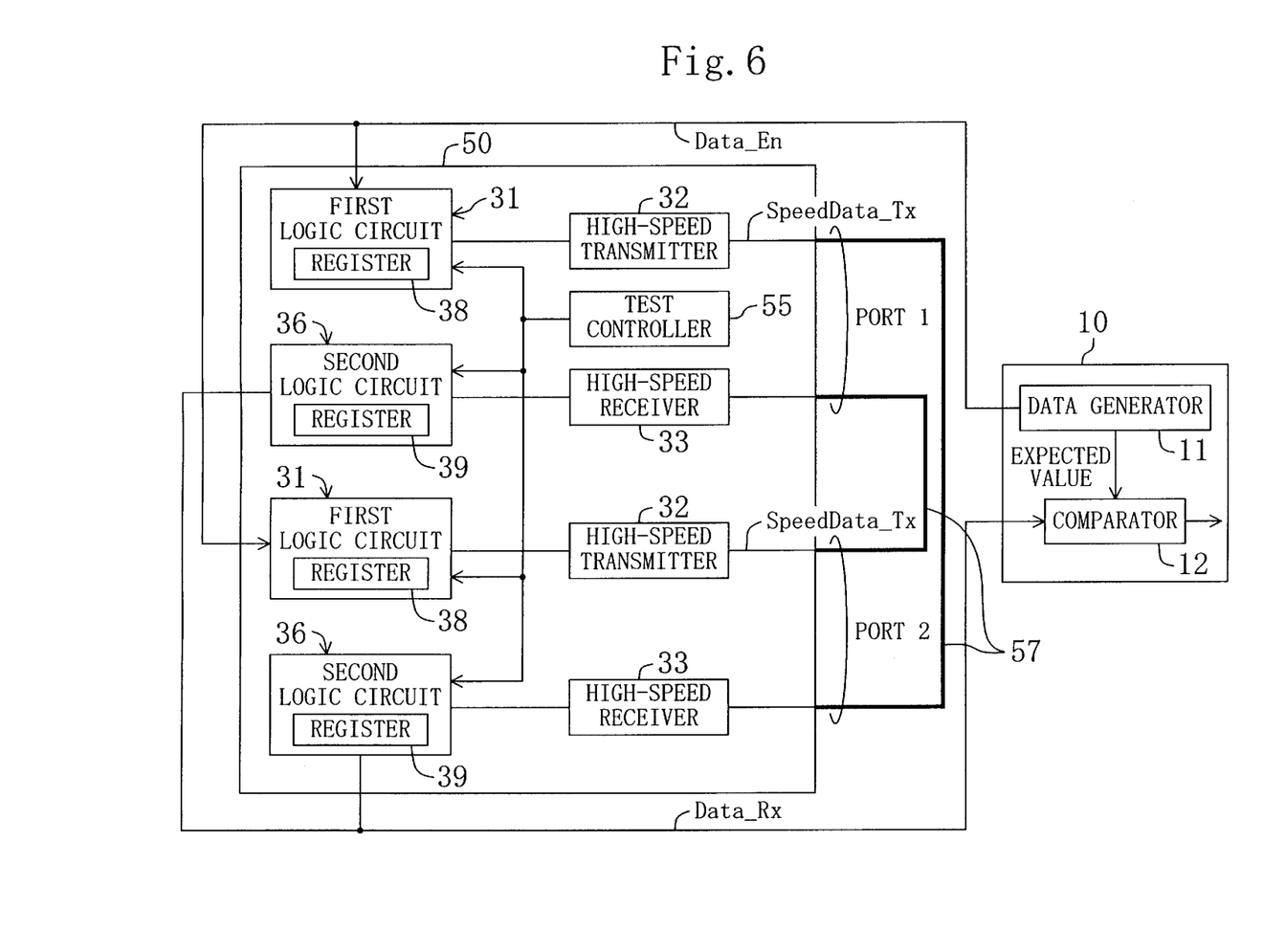
FIG. 6 illustrates an overall arrangement for testing a semiconductor integrated circuit according to a fifth embodiment of the present invention.

Next, a fifth exemplary embodiment of the present invention will be described. According to the fifth embodiment, a test is carried out using a differential cable complying with the IEEE 1394 standard. FIG. 6. illustrates an overall block arrangement for testing a semiconductor integrated circuit according to the fifth embodiment.

As shown in FIG. 6, this arrangement includes the tester 10 and a DUT 50. The DUT 50 includes first and second ports. Each port is made up of: first logic circuit 31 with a register 38; high-speed transmitter 32; high-speed receiver 33; second logic circuit 36 with a register 39; and shortcircuit structure between the transmitter 32 and receiver 33 like the DUT 20 according to the third embodiment. The switch 34 shown in FIG. 3 is not provided for this short-circuit structure. The tester 10 has the same configuration as the counterpart according to the third embodiment.

The high-speed transmitter 32 belonging to the first port is connected to the high-speed receiver 33 belonging to the second port via a differential cable 57 according to the IEEE 1394 standard while a test is being carried out. In the same way, the high-speed transmitter 32 belonging to the second port is connected to the high-speed receiver 33 belonging to the first port via another differential cable 57 according to the IEEE 1394 standard during the test. A test controller 55 controls the logic circuits 31 and 36 of these two ports by selectively enabling a test mode using a plurality of ports during a test such that high-transfer-rate signal data SpeedData_Tx is transmitted from the high-speed transmitter 32 of the first port, passed through the differential cable 57 outside of the DUT 50 and then received by the receiver 33 of the second port inside the DUT 50, for example.

According to the fourth embodiment, a high-transfer-rate differential signal is transmitted and received using a short-circuit structure between the output end of the transmitter 42 and the input end of the receiver 43 inside the DUT 40. Instead, according to the fifth embodiment, the high-transfer-rate differential signal is transmitted and received by getting the signal looped back through the differential cable 57 outside of the DUT 50.

Thus, according to the fifth embodiment, a high-transfer-rate differential signal, which has been transmitted from the transmitter 32 belonging to one port, is once output to, and passed through, the differential cable 57 outside of the DUT 50 and then received by the receiver 33 belonging to the other port by using the differential cable 57 during a test. Thus, the high-transfer-rate data signal, which is included in the high-transfer-rate differential signal transmitted from the transmitter 32, is received as it is, not as a strobe signal as described in the fourth embodiment. Accordingly, the expected value of the data signal may be stored in advance on the register 39 included in the second logic circuit 36 belonging to each port. Also, since the same differential cable 57 as that used actually during the normal operation of the DUT 50 is applicable for testing purposes, the reception of the high-transfer-rate differential signal is ensured.

In the foregoing embodiments, the test enable signal Data_En is generated from the data generator 11 in the tester 10. Alternatively, a low-transfer-rate signal pattern (test pattern) at about 50 Mbps may be generated and output to the DUT. Also, in the foregoing embodiments, a register for storing an expected value is provided within the second logic circuit in each DUT and a low-transfer-rate signal obtained during a test is compared to the expected value stored on the register. However, the present invention is in no way limited to such a specific embodiment. For example, the expected value may be stored within the tester 10, the low-transfer-rate signal obtained during a test may be output from the DUT to the tester 10 and then the low-transfer-rate signal and the expected value may be compared to each other in the tester 10.

What is claimed is:

1. A semiconductor integrated circuit comprising a transmitter for transmitting a high-transfer-rate differential signal consisting of two signals and a receiver, wherein the improvement comprises:
   a first logic circuit for receiving a low-transfer-rate signal from an external tester, generating the high-transfer-rate differential signal responsive to the low-transfer-rate signal and outputting the high-transfer-rate differential signal to the transmitter while the integrated circuit is connected to the external tester to carry out a test;
   a differential pair of signal lines for coupling the transmitter and the receiver together;
   switching means, which is provided for the signal lines and is turned ON during the test to transmit the high-transfer-rate differential signal from the transmitter to the receiver;
   a second logic circuit for receiving the high-transfer-rate differential signal from the receiver and converting the high-transfer-rate differential signal into another low-transfer-rate signal; and
   a delay circuit for delaying one of the two signals included in the high-transfer-rate differential signal to be input to the second logic circuit.

2. The circuit of claim 1, wherein the first logic circuit comprises a potential controller for raising or lowering a potential level of the high-transfer-rate differential signal to be generated.

3. The circuit of claim 1, wherein said delay circuit operates to generate a skew between signals transmitted on said differential pair of signal lines.

4. A semiconductor integrated circuit comprising:
   a first logic circuit for receiving a low-transfer-rate signal from an external tester, generating a high-transfer-rate differential signal responsive to the low-transfer-rate signal and transmitting the high-transfer-rate differential signal to a transmitter while the integrated circuit is connected to the external tester to carry out a test, the high-transfer-rate differential signal consisting of a data signal and a strobe signal;
   the transmitter for transmitting the high-transfer-rate differential signal;
   a receiver for receiving the high-transfer-rate differential signal from the transmitter with the data and strobe signals interchanged during the test;
   a second logic circuit for receiving the high-transfer-rate differential signal from the receiver and converting the strobe signal included in the high-transfer-rate differential signal into another low-transfer-rate signal; and
   a storage circuit for storing thereon an expected value of the low-transfer-rate signal obtained by the second logic circuit through the conversion.

5. A method for testing a semiconductor integrated circuit including a transmitter for transmitting a high-transfer-rate differential signal and a receiver, the high-transfer-rate differential signal consisting of a data signal and a strobe signal, the method comprising the steps of:
   receiving the high-transfer-rate differential signal, which has been transmitted from the transmitter, with the data and strobe signals interchanged; and
   comparing the strobe signal in the high-transfer-rate differential signal received to an expected value of the strobe signal.

* * * * *